United States Patent
Ahn et al.

(10) Patent No.: US 9,419,610 B2
(45) Date of Patent: Aug. 16, 2016

(54) LIGHT-SENSING CIRCUIT, METHOD OF OPERATING THE LIGHT-SENSING CIRCUIT, AND LIGHT-SENSING APPARATUS EMPLOYING THE LIGHT-SENSING CIRCUIT

(75) Inventors: Seung-eon Ahn, Hwaseong-si (KR); Sung-ho Park, Yongin-si (KR); I-hun Song, Seongnam-si (KR); Sang-hun Jeon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 758 days.

(21) Appl. No.: 12/926,831

(22) Filed: Dec. 13, 2010

(65) Prior Publication Data

US 2011/0284722 A1 Nov. 24, 2011

(30) Foreign Application Priority Data

May 20, 2010 (KR) .......................... 10-2010-0047647

(51) Int. Cl.
  *H01L 27/146* (2006.01)
  *H01J 40/14* (2006.01)
  *H03K 17/78* (2006.01)
  *H03K 17/94* (2006.01)

(52) U.S. Cl.
  CPC .............. *H03K 17/78* (2013.01); *H03K 17/941* (2013.01)

(58) Field of Classification Search
  CPC ... H03K 17/941; H03K 17/943; H03K 17/94; H03K 17/78; H03K 17/785; H01L 27/146; H01L 27/14601; H01L 27/14609; H01L 27/14612; H01L 27/14614; H01L 27/14616

USPC ............ 250/208.1; 257/431, 43, 57, 66, 462, 257/E31.079; 345/175
See application file for complete search history.

(56) References Cited

U.S. PATENT DOCUMENTS 4,598,305 A * 7/1986 Chiang et al. .................... 257/66
4,823,180 A * 4/1989 Wieder et al. .................. 257/290
5,644,146 A * 7/1997 Arai et al. ........................ 257/66

(Continued)

FOREIGN PATENT DOCUMENTS

CN 101473444 A 7/2009
CN 101614893 A 12/2009

(Continued)

OTHER PUBLICATIONS

European Search Report dated Oct. 6, 2011 issued in corresponding European Application No. 11151436.0.

(Continued)

*Primary Examiner* — John Lee
(74) *Attorney, Agent, or Firm* — Harness, Dickey & Pierce, P.L.C.

(57) ABSTRACT

Example embodiments are directed to a light-sensing circuit, a method of operating the light-sensing circuit, and a light-sensing apparatus including the light-sensing circuit. The light-sensing circuit includes a light-sensitive oxide semiconductor transistor that senses light; and a switching transistor connected to the light-sensing transistor in series and configured to output data. During a standby time, a low voltage is applied to the switching transistor and a high voltage is applied to the light-sensitive oxide semiconductor transistor, and when data is output, the high voltage is applied to the switching transistor and the low voltage is applied to the light-sensitive oxide semiconductor transistor.

22 Claims, 8 Drawing Sheets

(56) References Cited

U.S. PATENT DOCUMENTS

| | | | |
|---|---|---|---|
| 6,201,617 B1* | 3/2001 | Kusaka | 358/482 |
| 6,262,408 B1* | 7/2001 | Izumi et al. | 250/208.1 |
| 6,489,631 B2* | 12/2002 | Young et al. | 257/59 |
| 7,009,663 B2* | 3/2006 | Abileah et al. | 349/12 |
| 7,067,843 B2 | 6/2006 | Carcia et al. | |
| 7,164,164 B2* | 1/2007 | Nakamura et al. | 257/292 |
| 7,759,698 B2* | 7/2010 | Ogura | 257/185 |
| 7,773,139 B2* | 8/2010 | den Boer et al. | 348/302 |
| 7,940,252 B2* | 5/2011 | Chuang et al. | 345/175 |
| 8,044,943 B2* | 10/2011 | Chen | 345/175 |
| 8,058,657 B2* | 11/2011 | Lee et al. | 257/83 |
| 8,338,867 B2* | 12/2012 | Tai et al. | 257/290 |
| 2003/0205662 A1* | 11/2003 | Boer | 250/208.1 |
| 2004/0127038 A1 | 7/2004 | Carcia et al. | |
| 2005/0275038 A1* | 12/2005 | Shih et al. | 257/382 |
| 2006/0138403 A1* | 6/2006 | Yu | 257/40 |
| 2007/0176905 A1* | 8/2007 | Shih et al. | 345/173 |
| 2007/0252147 A1* | 11/2007 | Kim et al. | 257/59 |
| 2007/0257256 A1* | 11/2007 | Kugler | 257/40 |
| 2008/0055262 A1* | 3/2008 | Wu et al. | 345/173 |
| 2008/0142920 A1* | 6/2008 | Tai et al. | 257/463 |
| 2008/0158137 A1* | 7/2008 | Yoshida | 345/102 |
| 2008/0158199 A1* | 7/2008 | Lee et al. | 345/174 |
| 2008/0279334 A1* | 11/2008 | Takenaka et al. | 378/116 |
| 2008/0308840 A1* | 12/2008 | Ogura | 257/185 |
| 2009/0051645 A1 | 2/2009 | Chen et al. | |
| 2009/0101900 A1* | 4/2009 | Chuang et al. | 257/59 |
| 2009/0294765 A1 | 12/2009 | Tanaka et al. | |
| 2009/0315840 A1 | 12/2009 | Park et al. | |
| 2010/0026636 A1* | 2/2010 | Jang et al. | 345/173 |
| 2010/0097838 A1* | 4/2010 | Tanaka et al. | 365/112 |
| 2010/0214271 A1* | 8/2010 | Mizusako et al. | 345/204 |
| 2010/0295036 A1* | 11/2010 | Tsai et al. | 257/40 |
| 2010/0321279 A1* | 12/2010 | Jung et al. | 345/76 |
| 2011/0012115 A1* | 1/2011 | Jeon et al. | 257/59 |
| 2011/0057170 A1* | 3/2011 | Tsai et al. | 257/40 |
| 2011/0284722 A1* | 11/2011 | Ahn et al. | 250/208.1 |

FOREIGN PATENT DOCUMENTS

| | | |
|---|---|---|
| JP | 2007-87394 | 4/2007 |
| JP | 2008-153427 | 7/2008 |
| JP | 2009-111125 A | 5/2009 |
| JP | 2009-130209 | 6/2009 |
| JP | 2009-146100 A | 7/2009 |
| JP | 2009-182194 | 8/2009 |
| JP | 2009-53884 | 9/2009 |
| JP | 2009-290113 A | 12/2009 |
| KR | 20070033532 A | 3/2007 |
| KR | 20070102939 A | 10/2007 |
| KR | 10-2009-0084708 A | 8/2009 |
| WO | WO 2007/120010 | 10/2007 |

OTHER PUBLICATIONS

Tsukasa Eguchi et al., "24.2: A 1300-dpi Optical Image Sensor Using an a-Si:H Photo Diode Array Driven by LTPS TFTs", SID 07 Digest, 2007, pp. 1097-1100.

English translation of Chinese Office Action mailed Mar. 26, 2015.

Dec. 2, 2014 Japanese Office Action issued in corresponding Japanese Application No. 2011-043665 with translation.

Korean Office Action dated Mar. 18, 2016 issued in corresponding Korean Patent Application No. 10-2010-0047647 (English translation provided).

* cited by examiner

LIGHT-SENSING CIRCUIT, METHOD OF OPERATING THE LIGHT-SENSING CIRCUIT, AND LIGHT-SENSING APPARATUS EMPLOYING THE LIGHT-SENSING CIRCUIT

CROSS-REFERENCE TO RELATED APPLICATIONS

This application claims priority under 35 U.S.C. §119 to Korean Patent Application No. 10-2010-0047647, filed on May 20, 2010, in the Korean Intellectual Property Office, the disclosure of which is incorporated herein in its entirety by reference.

BACKGROUND

1. Field

Example embodiments relate to light-sensing circuits, methods of operating the light-sensing circuits, and light-sensing apparatuses including the light-sensing circuits, and more particularly, to light-sensing circuits including a light-sensitive oxide semiconductor transistor as a light-sensing device, methods of operating the light-sensing circuits, and light-sensing apparatuses, such as an optical touch panel or an image acquisition apparatus, including the light-sensing circuits.

2. Description of the Related Art

Touch screens are apparatuses that allow input data to be directly input on a display screen in such a way that when, for example, a person's finger or a pen or similar is brought into contact at a particular position of the display screen, the contact position is identified, and then a corresponding process is performed by software. To do this, touch screens further include a touch panel that is attached to a general display panel to perform the function described above. Examples of the touch panel include a resistive overlay-type touch panel, a capacitive overlay-type touch panel, a surface acoustic wave (SAW)-type touch panel, an infrared beam-type touch panel, and a piezo electric-type touch panel or the like. Such touch screens have alternative input devices such as a keyboard or a mouse, and are used in a variety of fields.

However, widely used touch panels operate only when a person's finger or pen is brought into direct contact with the panels. Accordingly, when resistive overlay-type touch panels, which are the most widely used among the touch panels, are used, an upper or lower conductive layer may be damaged due to external pressure. Moreover, resistive overlay-type touch panels may be used only in small screens having a size of 10 inches or less. Large touch panels for large screens fail to perform a sufficient function due to a line resistance and a parasitic resistance. Thus, currently, touch panels are used in a small-size or middle-size display of, for example, a general desktop computer, a notebook computer, or a portable device, such as a mobile phone or a navigation device. Thus, the touch panels are not suitable when a large display is used and a distance between a user and a display is increased.

Recently, optical touch panels that perform the same function as the touch panels by sensing light instead of the contact with a person's finger or a pen have been introduced. In an optical touch panels, a small light-sensing device is used. Meanwhile, an image acquisition apparatus, such as a complimentary metal oxide semiconductor (CMOS) or a charge-coupled device (CCD), also requires a light-sensing device that is capable of sensing light in order to acquire an image. An example of a generally used light-sensing device is a photodiode having as a basic structure a PN junction of a semiconductor such as silicon.

However, a silicon photodiode does not have a sufficient light-derived current change. Thus, charges, which are generated in a photodiode when light is irradiated, are accumulated in a capacitor for a certain period of time, and then a signal corresponding to the intensity of light is generated based on the intensity of charges accumulated in the capacitor. When a capacitor is used as described above, however, the larger an optical touch panel or image acquisition device is, the higher parasitic capacitance. Thus, large optical touch panels or image acquisition devices may be difficult to manufacture.

SUMMARY

According to example embodiments, a light-sensing circuit includes a light-sensing transistor configured to sense light; and a switching transistor connected in series with the light-sensing transistor and configured to output data, wherein the light-sensing transistor is a light-sensitive oxide semiconductor transistor including a light-sensitive oxide semiconductor as a channel layer.

According to example embodiments, the light-sensing circuit further includes a first gate line connected to a gate of the switching transistor; a data line connected to a source of the switching transistor; a driving voltage line connected to a drain of the light-sensing transistor; and a second gate line connected to a gate of the light-sensing transistor.

According to example embodiments, wherein, during a standby time, a low voltage is applied to the switching transistor via the first gate line and a high voltage is applied to the light-sensing transistor via the second gate line; and, when data is output, the high voltage is applied to the switching transistor via the first gate line and the low voltage is applied to the light-sensing transistor via the second gate line.

According to example embodiments, wherein the high voltage is a higher voltage among a positive voltage that removes charges trapped in the light-sensing transistor and a voltage that turns ON the switching transistor, and the low voltage is a lower voltage among a threshold voltage of the switching transistor and a threshold voltage of the light-sensing transistor.

According to example embodiments, the light-sensing transistor includes a substrate; an insulating layer on the substrate; a gate on at least a portion of the insulating layer; a gate insulating layer that covers at least a surrounding of the gate and is on the insulating layer and the gate; a channel layer on the gate insulating layer; a source and a drain respectively covering ends of the channel layer; and a transparent insulating layer on the source, the drain, and the channel layer, wherein the channel layer includes a light-sensitive oxide semiconductor.

According to example embodiments, the light-sensing transistor includes a substrate; a channel layer on the substrate; a gate insulating layer on a center portion of the channel layer; a gate on the gate insulating layer; a source and a drain at an interval from the gate and on both sides of the gate on the channel layer; and a transparent insulating layer on the gate, the source, and the drain, wherein the channel layer includes a light-sensitive oxide semiconductor.

According to example embodiments, the light-sensitive oxide semiconductor includes a ZnO-based oxide.

For example, the ZnO-based oxide may include ZnO or a mixture including ZnO and at least one material selected from a group consisting of Hf, Y, Ta, Zr, Ti, Cu, Ni, Cr, In, Ga, Al, Sn, and Mg.

According to example embodiments, a degree of sensitivity of the light-sensitive transistor is dependent on a color or a wavelength of light incident on the light-sensitive transistor.

According to example embodiments, a degree of sensitivity of the light-sensitive transistor is dependent on an intensity of light incident on the light-sensitive transistor.

According to example embodiments, a degree of sensitivity of the light-sensitive transistor is dependent on a color and an intensity of light incident on the light-sensitive transistor.

According to example embodiments, a method of operating a light-sensing circuit including a light-sensing transistor configured to sense light and a switching transistor configured to output data, the light-sensing transistor and the switching transistor connected in series, the method includes performing a standby operation by applying a low voltage to a gate of the switching transistor and applying a high voltage to a gate of the light-sensing transistor; and performing a data-outputting operation by applying the high voltage to the gate of the switching transistor, and applying the low voltage to the gate of the light-sensing transistor.

According to example embodiments, the method further includes applying, as the high voltage, a higher voltage among a positive voltage that removes charges trapped in the light-sensing transistor and a voltage that turns ON the switching transistor.

According to example embodiments, the method further includes applying, as the low voltage, a lower voltage among a threshold voltage of the switching transistor and a threshold voltage of the light-sensing transistor.

According to example embodiments, performing the standby operation includes: outputting low signals from the switching transistor independent of light incident on the light-sensing transistor.

According to example embodiments, performing the data-output operation includes: outputting a high signal from the switching transistor when light is incident on the light-sensing transistor, and outputting a low signal from the switching transistor when light is not incident on the light-sensing transistor.

According to example embodiments, performing the data-output operation further includes: outputting, by the switching transistor, the high signal proportional to an intensity of light incident on the light-sensing transistor.

According to example embodiments, the light-sensing transistor is a light-sensitive oxide semiconductor transistor including a light-sensitive oxide semiconductor as a channel layer.

According to example embodiments, the light-sensitive oxide semiconductor includes a ZnO-based oxide.

For example, the ZnO-based oxide may include ZnO or a mixture including ZnO and at least one material selected from a group consisting of Hf, Y, Ta, Zr, Ti, Cu, Ni, Cr, In, Ga, Al, Sn, and Mg.

According to example embodiments, a light-sensing apparatus includes a light-sensing panel configured to sense incident light; a gate driver configured to provide a gate voltage to the light sensing panel; a data driver configured to measure an output of the light sensing panel; and an analog digital (A/D) converter (ADC) configured to convert an analog signal output by the data driver into a digital signal, wherein the light-sensing panel includes an array of a plurality of light-sensing pixels, each of the light-sensing pixels including the light-sensing circuit of claim 1.

According to example embodiments, the light-sensing panel further includes a plurality of first gate lines and second gate lines as rows, and a plurality of driving voltage lines and data lines as columns.

According to example embodiments, the first and second gate lines are connected to the gate driver, and the data lines are connected to the data driver.

According to example embodiments, the gate driver is configured to sequentially provide a gate voltage to rows of the light-sensing pixels via the first and second gate lines.

According to example embodiments, the light-sensing apparatus is an image acquisition device, or a remote optical touch panel.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
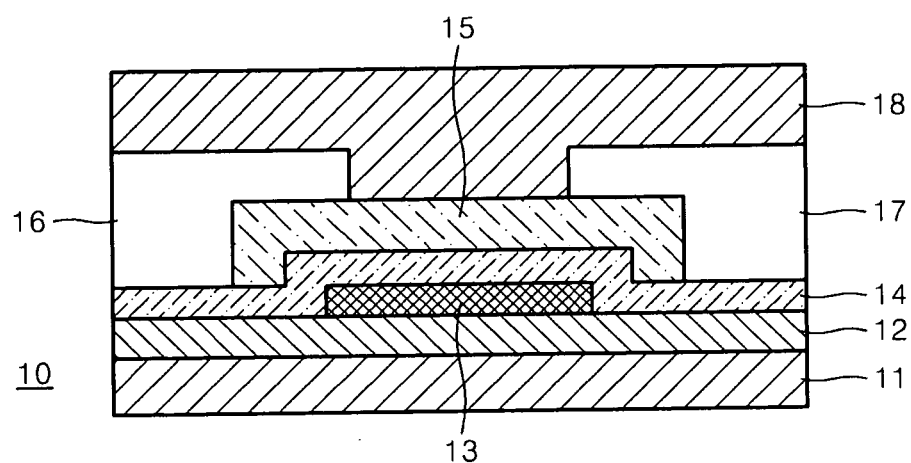
FIG. 1 is a cross-sectional view of a light-sensitive oxide semiconductor transistor which is used as a light-sensing device, according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A light-sensitive oxide semiconductor transistor includes a light-sensitive oxide semiconductor as a channel material. The channel material includes an oxide semiconductor material, such as a ZnO-based material. The ZnO-based material may include ZnO or a mixture including ZnO and at least one material selected from the group consisting of Hf, Y, Ta, Zr, Ti, Cu, Ni, Cr, In, Ga, Al, Sn, and Mg. Examples of the ZnO-based material include ZnO, TaZnO, InZnO (IZO), and gallium indium zinc oxide (GaInZnO or GIZO). In the light-sensitive oxide semiconductor transistor, a threshold voltage and a drain current are changed according to a wavelength or intensity of incident light. Due to this feature, the light-sensitive oxide semiconductor transistor is used as a light-sensing device.

For example, FIG. 1 is a schematic cross-sectional view of a light-sensitive oxide semiconductor transistor 10 which is used as a light-sensing device, according to example embodiments. Referring to FIG. 1, the light-sensitive oxide semiconductor transistor 10 includes a substrate 11, an insulating layer 12 disposed on the substrate 11, a gate 13 disposed on a portion of the insulating layer 12, a gate insulating layer 14 that covers at least the surrounding of the gate 13 and is disposed on the insulating layer 12 and the gate 13, a channel layer 15 disposed on the gate insulating layer 14, a source 16 and a drain 17 respectively covering ends of the channel layer 15, and a transparent insulating layer 18 disposed on the source 16, the drain 17, and the channel layer 15.

The substrate 11 may be formed of a conventional substrate material, such as glass or silicon. The insulating layer 12, the gate insulating layer 14, and the transparent insulating layer 18 may be formed of, for example, $SiO_2$. If the substrate 11 is formed of an insulating material, the insulating layer 12 disposed on the substrate 11 may not be formed. The gate 13, the source 16, and the drain 17 each may be formed of a conductive metal and/or a conductive metal oxide. For example, when the light-sensitive oxide semiconductor transistor 10 is used in an optical touch panel that is attached to a display panel, the gate 13, the source 16, and the drain 17 may be formed of a transparent conductive material, such as ITO. However, when the light-sensitive oxide semiconductor transistor 10 does not need to be transparent, the substrate 11, the insulating layer 12, the gate 13, the gate insulating layer 14, the source 16, and the drain 17 may not be transparent. In this regard, only the transparent insulating layer 18 may to be transparent to guide light to the channel layer 15. The channel layer 15 may be, as described above, formed of a light-sensitive oxide semiconductor material. For example, the channel layer 15 may be formed of a ZnO-based material, such as ZnO, TaZnO, InZnO (IZO), or gallium indium zinc oxide (GaInZnO or GIZO), or a mixture including ZnO and at least one material selected from the group consisting of Hf, Y, Ta, Zr, Ti, Cu, Ni, Cr, In, Ga, Al, Sn, and Mg.

Figure 2:
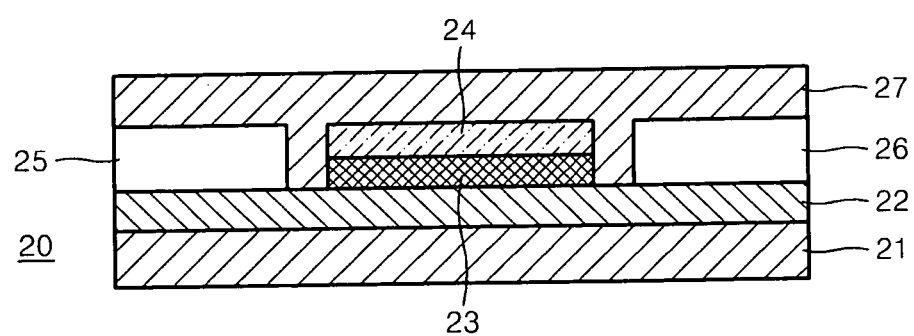
FIG. 2 is a cross-sectional view of a light-sensitive oxide semiconductor transistor which is used as a light-sensing device, according to example embodiments.

The light-sensitive oxide semiconductor transistor 10 of FIG. 1 has a bottom gate structure, that is, a gate is disposed under a channel. However, the light-sensitive oxide semiconductor transistor 10 may also have a top gate structure for use as the light-sensing device. FIG. 2 is a schematic cross-sectional view of a light-sensitive oxide semiconductor transistor 20 having a top gate structure, according to example embodiments.

Referring to FIG. 2, the light-sensitive oxide semiconductor transistor 20 having the top gate structure may include, for example, a substrate 21, a channel layer 22 disposed on the substrate 21, a gate insulating layer 23 disposed on a center portion of the channel layer 22, a gate 24 disposed on the gate insulating layer 23, a source 25 and a drain 26 disposed at an interval on both sides of the gate 24 on the channel layer 22, and a transparent insulating layer 27 disposed on the gate, 24, the source 25, and the drain 26. In regard to the light-sensitive oxide semiconductor transistor 20 having the top gate structure as illustrated in FIG. 2, the gate 24, the source 25, and the drain 26 may be formed of a transparent conductive material, such as ITO, so that light is allowed to enter the channel layer 22.

Figure 3:
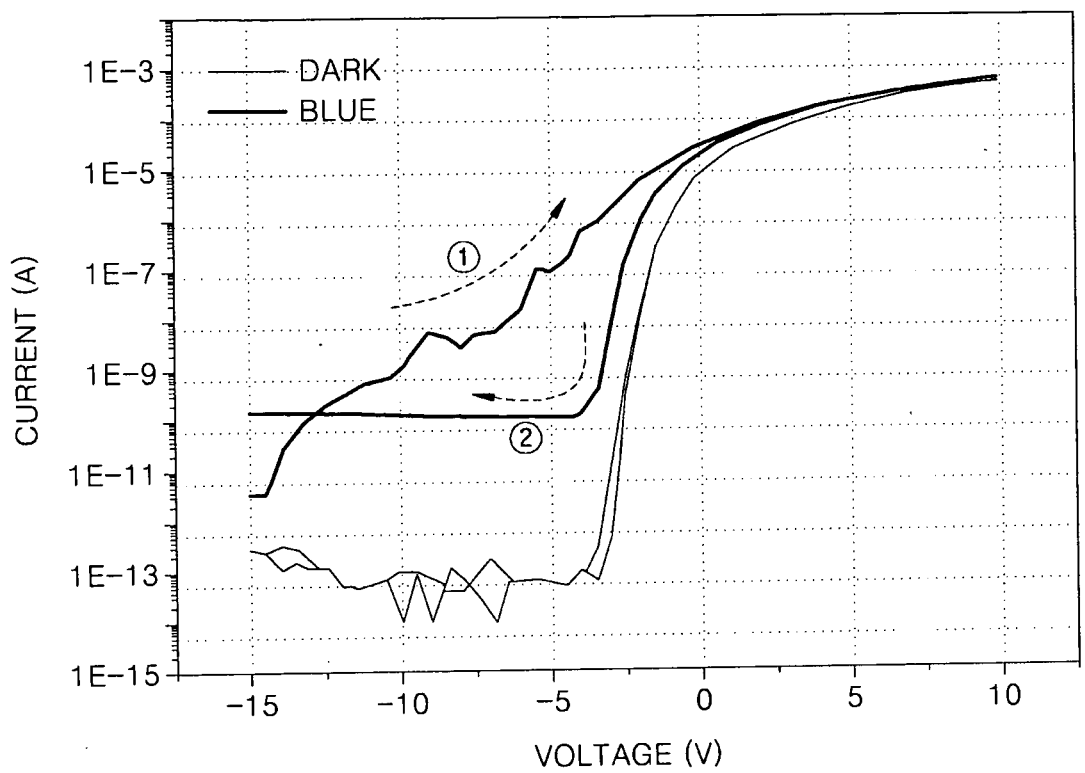
FIGS. 3 and 4 are example graphs showing an operation characteristic of a light-sensitive oxide semiconductor transistor.
Figure 4:
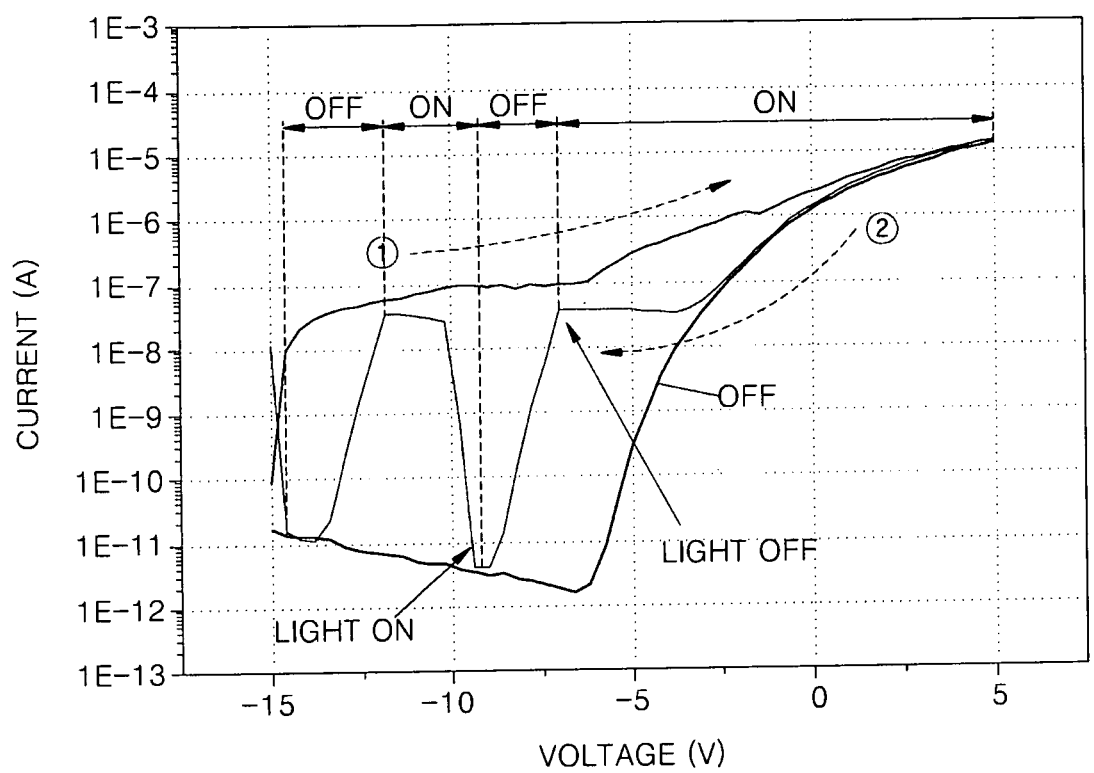

FIGS. 3 and 4 are example graphs showing an operation characteristic of the light-sensitive oxide semiconductor transistors 10 and 20, that shows drain current characteristics with respect to voltage. Referring to FIG. 3, when light is irradiated to the light-sensitive oxide semiconductor transistors 10 and 20, a drain current is substantially increased at a voltage lower than a threshold voltage, compared to when light is not irradiated. That is, as shown in FIG. 3, a ratio of a drain current when light is irradiated to the light-sensitive oxide semiconductor transistors 10 and 20 to a drain current when light is not irradiated to the light-sensitive oxide semiconductor transistors 10 and 20 is substantially high. Accordingly, when the light-sensitive oxide semiconductor transistors 10 and 20 are used as a light-sensing device, various advantageous characteristics may be obtained.

As described above, in the case of a silicon photodiode or amorphous silicon a-Si transistor, the ratio of a current when light is irradiated to a current when light is not irradiated is relatively low. Accordingly, charges, which are generated when light is irradiated, are accumulated in a capacitor for a certain period of time, and then a signal corresponding to the intensity of light is generated based on the magnitude of charges accumulated in the capacitor. Due to the use of the capacitor, when a large light-sensing apparatus is manufactured, parasitic capacitance may increase and also the structure of a circuit may be complicated.

Whereas, in the case of light-sensitive oxide semiconductor transistors 10 and 20, the ratio of a drain current when light is irradiated to a drain current when light is not irradiated is high, and thus when light is irradiated, a relatively high optical current of a few nA to hundreds of nA may be generated. Accordingly, when the light-sensitive oxide semiconductor transistors 10 and 20 are used as a light-sensing device, a current may be directly sensed without a capacitor. Since the light-sensing circuit does not require a capacitor, a large light-sensing apparatus may be manufactured with negligible parasitic capacitance. In addition, when a capacitor is used, a complicated operating method for charging and discharging a capacitor is required and correspondingly, more time is consumed. However, when a current is directly sensed, an operating method is simple and there is negligible time delay. In addition, when the amount of current is low, noise caused by the surrounding interconnection lines and circuits may largely affect; however, when the light-sensitive oxide semiconductor transistors 10 and 20 are used and the amount of current is relatively high, noise may affect less. Moreover, since a capacitor is not used, a space that the capacitor occupies is saved in a pixel, and thus, a light-receiving region in the pixel is increased and a smaller pixel may be manufactured.

Referring to FIG. 3, the light-sensitive oxide semiconductor transistors 10 and 20 have different characteristics according to a sweep direction of a gate voltage when light is irradiated. For example, in FIG. 3, a first graph indicated by '①' shows characteristics of a gate voltage when the gate voltage is swept in a gate voltage increase direction, that is, a direction from a negative voltage to a positive voltage, and a second graph indicated by '②' shows characteristics of the gate voltage when the gate voltage is swept in a gate voltage decrease direction, that is, a direction from the positive voltage to the negative voltage. As observed in the first graph, when the gate voltage is swept in the positive direction, a threshold voltage of the light-sensitive oxide semiconductor transistors 10 and 20 when light is irradiated appears to move in the negative direction. On the other hand, as observed in the second graph, when the gate voltage is swept in the negative direction, only off-current is increased while the threshold voltage of the light-sensitive oxide semiconductor transistors 10 and 20 when light is irradiated stays constant.

FIG. 4 is an example graph exemplarily showing an operation characteristic difference of the light-sensitive oxide semiconductor transistors 10 and 20 according to the sweep direction when light is irradiated and then is not irradiated. Referring to FIG. 4, like a first graph indicated by '①', when the gate voltage is swept in the positive direction, the irradiated light has little effect on the drain current. That is, when the gate voltage is swept in the positive direction, even when light is irradiated and then is not irradiated, a corresponding drain current change is minimal. On the other hand, like a second graph indicated by '②', when the gate voltage is swept in the negative direction, the irradiated light has a relatively greater effect on the drain current. That is, when the gate voltage is swept in the negative direction, once the irradiation of light is stopped, the drain current is decreased, and then when light is irradiated, the drain current is increased. Referring to FIG. 4, the drain current when light is not irradiated is decreased to an off-current level when the gate voltage is swept in the absence of light.

Such different characteristics shown in FIGS. 3 and 4 according to a sweep direction are similar to a phenomenon that is used in recording data in a general flash memory, and may occur when charges are trapped inside the channel layers 15 and 22 of the light-sensitive oxide semiconductor transistors 10 and 20, or at the interface of the channel layers 15 and 22 and the gate insulating layers 14 and 23. For example, when a high negative voltage is applied together with light, for example, a voltage lower than a threshold voltage is applied to a gate, holes that are generated in the channel layers 15 and 22 due to light may move to the interfaces of the gate insulating layer 14 and 23 and the channel layers 15 and 22 and are trapped at the interfaces. Once trapped, charges are not removed until a sufficiently high positive voltage is applied to the gate. Accordingly, as shown in the first graphs, once charges are trapped, the drain current is not lowered even when the irradiation of light is stopped. The drain current may be lowered when a positive voltage is applied to the gate to remove the trapped charges. For example, as shown in the second graphs, when the gate voltage is swept in the direction from the positive voltage to the negative voltage, an optical current effect appears independent from the charge trapping.

Figure 5:
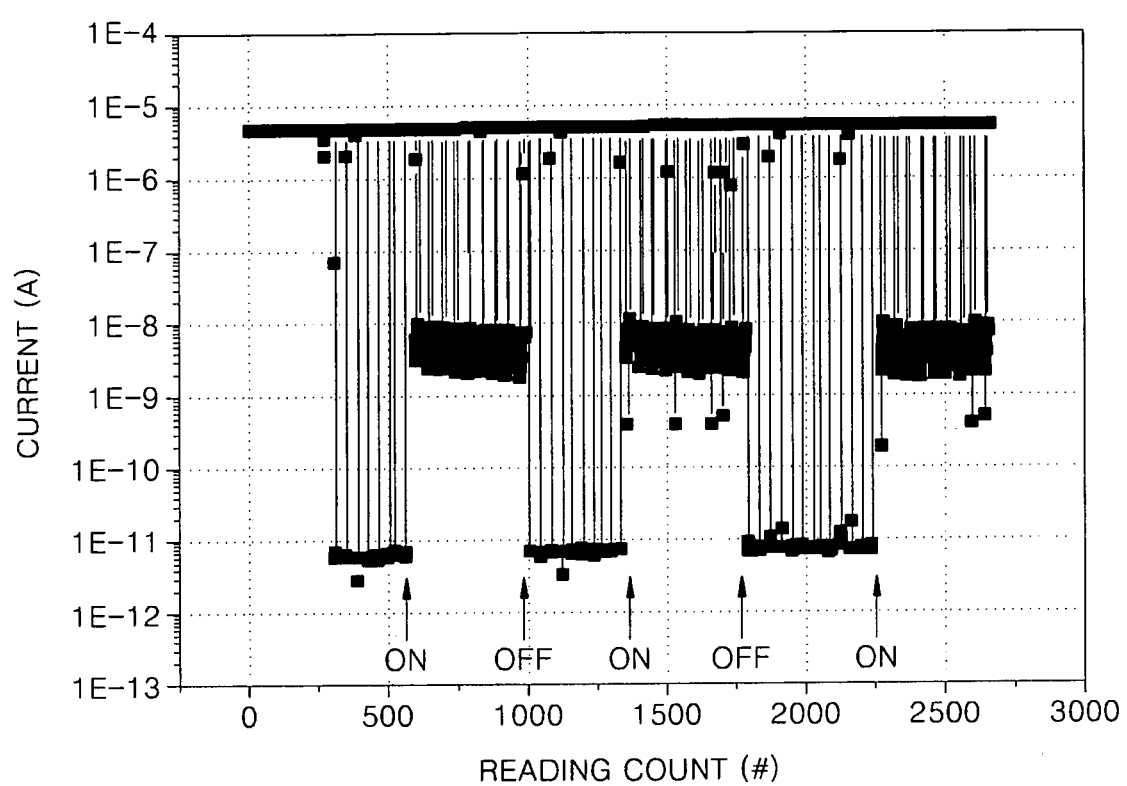
FIG. 5 is an example graph showing another operation characteristic of a light-sensitive oxide semiconductor transistor.

For example, FIG. 5 shows a drain current change when the gate voltage is swept from a positive voltage to a negative voltage at a sampling cycle of 10 ms and light is applied and then is not applied. As illustrated in FIG. 5, when the gate voltage is swept in the direction from the positive voltage to the negative voltage, the light-sensitive oxide semiconductor transistors 10 and 20 rapidly respond to light independent of the charge trapping. Accordingly, a light-sensing circuit including the light-sensitive oxide semiconductor transistors 10 and 20 and a method of operating the light-sensing circuit includes trapping charges.

Figure 6:
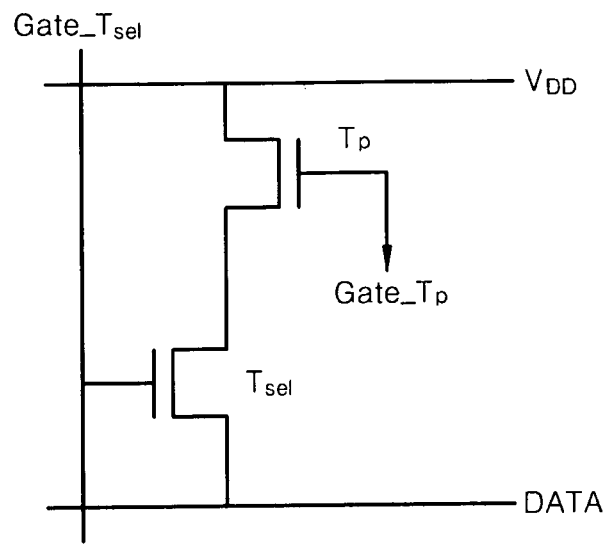
FIG. 6 is a circuit diagram illustrating a structure of a light-sensing circuit according to example embodiments.

FIG. 6 is a circuit diagram illustrating a structure of a light-sensing circuit including the light-sensitive oxide semiconductor transistors 10 and/or 20, according to example embodiments. The circuit diagram of FIG. 6 is designed in consideration of the above-described characteristics of the light-sensitive oxide semiconductor transistors 10 and 20. For example, the light-sensing circuit of FIG. 6 may be disposed in each pixel of a light-sensing apparatus such as an optical touch panel or an image acquisition device. Referring to FIG. 6, the light-sensing circuit may include only one light-sensing transistor Tp and one switching transistor Tsel, which are connected in series without a capacitor. For example, a source of the light-sensing transistor Tp may be connected to a drain of the switching transistor Tsel. In this regard, the light-sensing transistor Tp may be the light-sensitive oxide semiconductor transistors 10 and 20 for sensing light. In addition, the switching transistor Tsel, which is used to output data, may be a normal thin film transistor that does not have light-sensitive characteristics. In addition, the light-sensing circuit may further include a first gate line GATE_Tsel connected to a gate of the switching transistor Tsel, a data line DATA connected to a source of the switching transistor Tsel, a driving voltage line Vdd connected to a drain of the light-sensing transistor Tp, and a second gate line GATE_Tp connected to a gate of the light-sensing transistor Tp.

Figure 7:
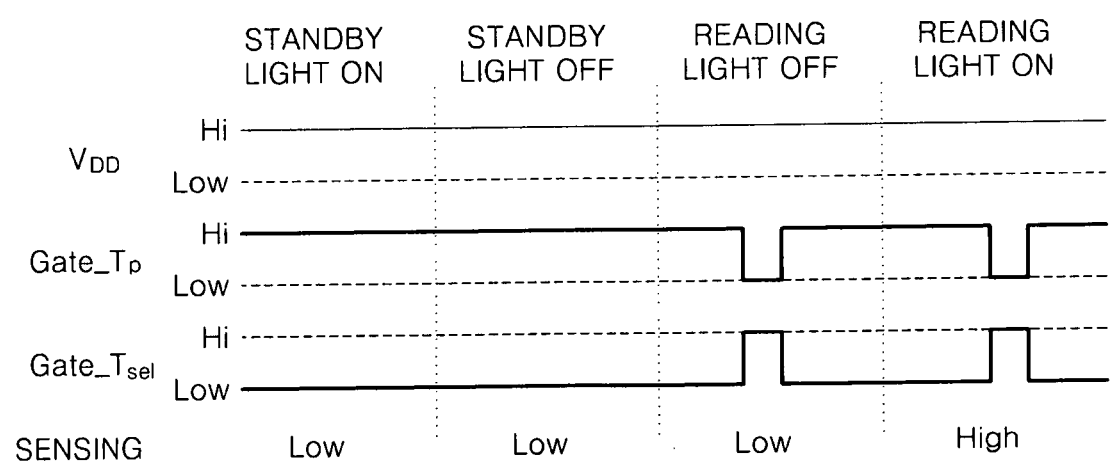
FIG. 7 is a timing diagram illustrating a method of operating the light-sensing circuit of FIG. 6.

FIG. 7 is a timing diagram illustrating a method of operating the light-sensing circuit of FIG. 6. Referring to the circuit diagram of FIG. 6 and the timing diagram of FIG. 7, during a standby time when data is not output from the light-sensing circuit, a low voltage is applied to the first gate line GATE_Tsel and the switching transistor Tsel is in an OFF state. In this regard, the low voltage may be, for example, a voltage lower than a threshold voltage of the switching transistor Tsel. Meanwhile, a high voltage is applied to the gate of the light-sensing transistor Tp via the second gate line GATE_Tp. In this regard, the high voltage may be, for example, a positive voltage that is sufficiently high to remove the trapped charges inside a channel layer of the light-sensing transistor Tp or the interface between the channel layer and an insulating layer. Accordingly, during the standby time, even when light is irradiated to the light-sensing transistor Tp, the data line DATA remains in a low state because the switching transistor Tsel is in the OFF state. That is, low current flows via the data line DATA and thus, a low signal is output.

On the other hand, when data is output from the light-sensing circuit, a high voltage is applied to the switching transistor Tsel via the first gate line GATE_Tsel so as to turn ON the switching transistor Tsel. Accordingly, the high voltage may be a higher voltage among a positive voltage for removing charges trapped in the light-sensing transistor Tp and a voltage for turning ON the switching transistor Tsel. Simultaneously, a low voltage is applied to the gate of the light-sensing transistor Tp via the second gate line GATE_Tp. In this regard, the low voltage may be a voltage that is lower than a threshold voltage of the light-sensing transistor Tp. Accordingly, the low voltage may be a lower voltage among the threshold voltage of the switching transistor Tsel and the threshold voltage of the light-sensing transistor Tp. In this state, if light is not irradiated on the light-sensing transistor Tp, as illustrated in FIG. 7, a low signal is output from the source of the light-sensing transistor Tp to the data line DATA via the switching transistor Tsel. And, if light is irradiated on the light-sensing transistor Tp, an off current of the light-sensing transistor Tp is increased and a high current flows to the data line DATA and a high signal is output. In this regard, since the trapped charges have already been removed from the light-sensing transistor Tp, like the second graph of FIG. 3, only an optical current effect flows in the data line DATA. The magnitude of the output high signal may be, for example, proportional to the intensity of light that irradiates on the light-sensing transistor Tp. Meanwhile, an operating voltage supplied to the drain of the light-sensing transistor Tp may be maintained constant in the entire course.

Figure 8:
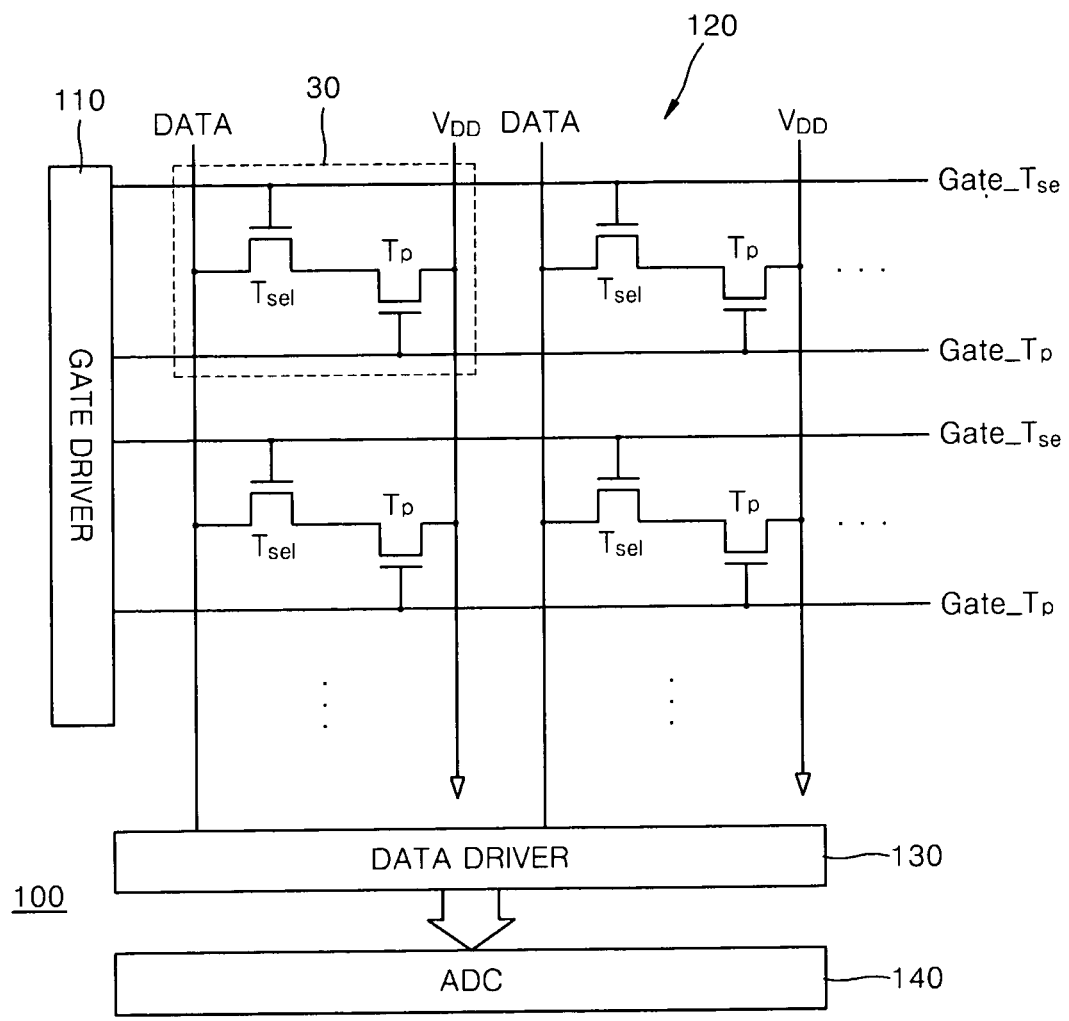
FIG. 8 is a schematic block diagram of a light-sensing apparatus including the light-sensing circuit of FIG. 6.

FIG. 8 is a schematic diagram of a light-sensing apparatus 100 including the light-sensing circuit of FIG. 6. Referring to FIG. 8, the light-sensing apparatus 100 according to the example embodiments may include, for example, a light-sensing panel 120 for sensing incident light, a gate driver 110 for providing a gate voltage to the light-sensing panel 120, a data driver 130 for measuring an output of the light-sensing panel 120, and an analog digital (A/D) converter ADC 140 for converting an analog output signal transmitted by the data driver 130 into a digital signal.

The light-sensing panel 120 may include an array of a plurality of light-sensing pixels 30, each of which includes the light-sensing circuit illustrated in FIG. 6. The light sensing circuit may include the light-sensitive oxide semiconductor transistors 10 and/or 20. Accordingly, the light-sensing panel 120 may further include a plurality of first gate lines GATE_Tsel and second gate lines GATE_Tp aligned in rows, and a plurality of driving voltage lines Vdd and data lines DATA aligned in columns. The first gate lines GATE_Tsel and the second gate lines GATE_Tp are connected to the gate driver 110. For example, the gate driver 110 may sequentially provide a gate voltage to rows of the light-sensing pixels 30 via the first gate lines GATE_Tsel and the second gate lines GATE_Tp. In addition, the data lines DATA are connected to the data driver 130. For example, the data driver 130 may measure output signals sequentially transmitted by the columns of the light-sensing pixels 30.

The light-sensing apparatus 100 may be used in various light-sensing apparatuses. For example, instead of an image acquisition device used in a digital camera, such as a charge-coupled device (CCD) image sensor or a complementary metal-oxide semiconductor (CMOS) image sensor, the light-sensing apparatus 100 may be used. In addition, instead of a conventional touch panel, the light-sensing apparatus 100 may be used as a remote optical touch panel for performing a touch function by sensing light emitted from a light source, such as a laser pointer. In this regard, the light-sensing apparatus 100 may be attached to a surface of a display apparatus. Alternatively, the light-sensing apparatus 100 may be integrated with the display apparatus and may form one body. For example, in general, one color pixel of a display apparatus includes three red, green, and blue (RGB) cells, and may further include a cell including the light-sensing circuit illustrated in FIG. 6.

Figure 9:
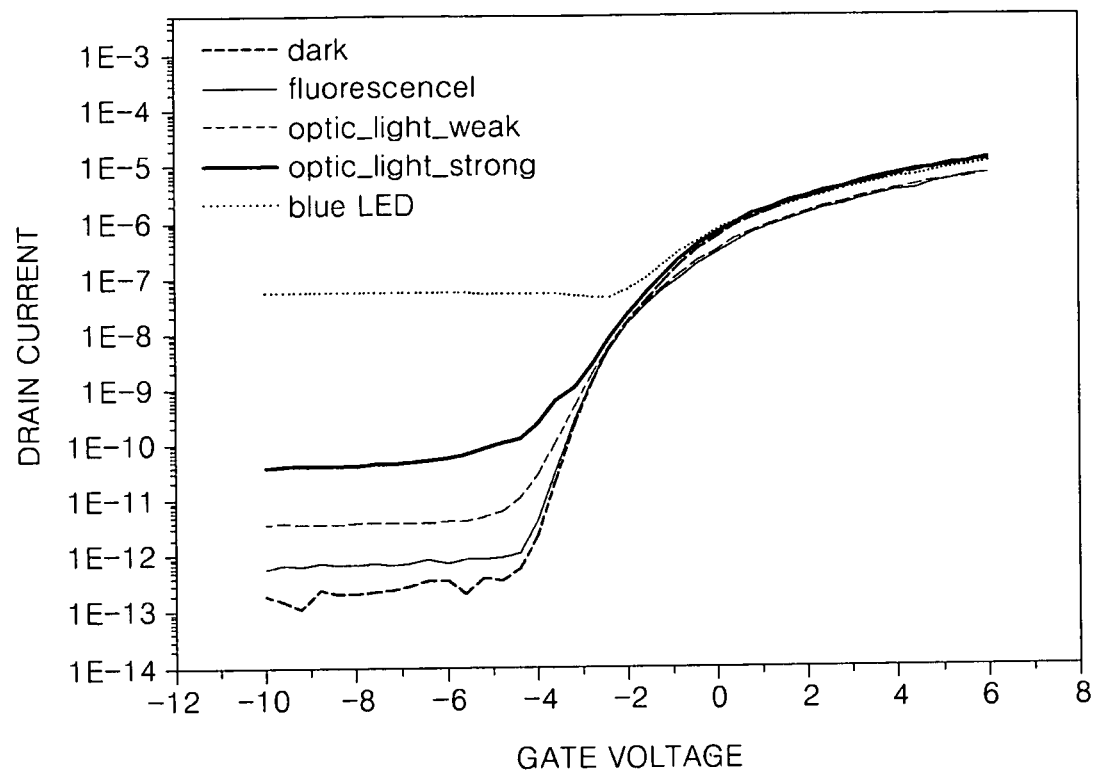
FIG. 9 is an example graph showing operation characteristics of a light-sensitive oxide semiconductor transistor with respect to various kinds of light.
Figure 10:
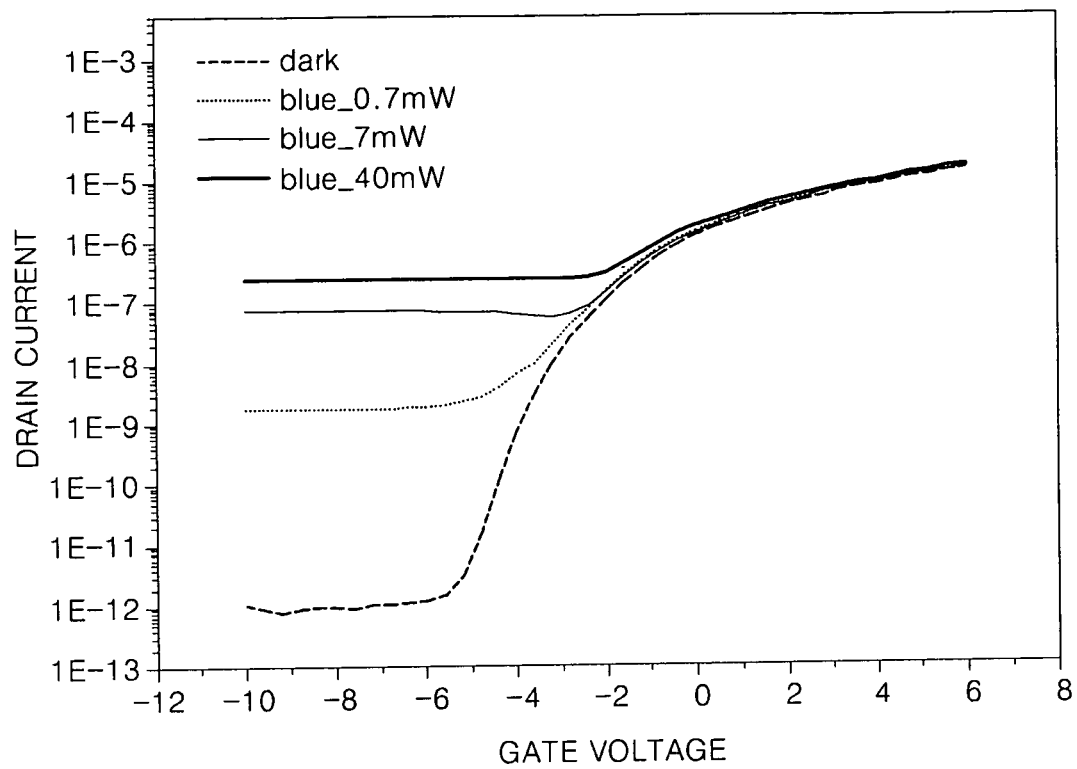
FIG. 10 is an example graph showing operation characteristics of a light-sensitive oxide semiconductor transistor with respect to the intensity of incident light.

When the light-sensing apparatus 100 is used as a remote optical touch panel, for example, other surrounding light that enters the light-sensing apparatus 100 may not be differentiated from "touch light" for performing a touch function. FIG. 9 is an example graph showing operation characteristics of the light-sensitive oxide semiconductor transistors 10 and 20 with respect to various kinds of light. Referring to FIG. 9, the light-sensitive oxide semiconductor transistors 10 and 20 are sensitive to blue light among various kinds of light having the same intensity. For example, the light-sensitive oxide semiconductor transistors 10 and 20 are sensitive to blue light (for example, emitted from a blue light emitting diode (LED)). In addition, as illustrated in a graph of FIG. 10, the light-sensitive oxide semiconductor transistors 10 and 20 are more sensitive to blue light with higher intensity. Accordingly, when light with a short wavelength, such as blue light or a ultraviolet (UV) light, is used as a touch light, even when the surrounding light, such as an indoor electric light or sunlight, is present, the touch light may be differentiated.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:
1. A light-sensing circuit comprising:
a light-sensing transistor configured to sense light; and
a switching transistor connected in series to the light-sensing transistor without a capacitor connected to a node between the light-sensing transistor and the switching transistor connected in series, the light-sensing transistor being a light-sensitive oxide semiconductor transistor including a light-sensitive oxide semiconductor as a channel layer, the light-sensing circuit being a pixel circuit;
a first gate line connected to a gate of the switching transistor;
a data line connected to a source of the switching transistor;
a driving voltage line connected to a drain of the light-sensing transistor;
a second gate line connected to a gate of the light-sensing transistor, wherein
the light-sensing circuit being configured to apply a low voltage to the switching transistor via the first gate line and to apply a high voltage to the light-sensing transistor via the second gate line during a standby time, and
the light-sensing circuit being configured to apply the high voltage to the switching transistor via the first gate line and to apply the low voltage to the light-sensing transistor via the second gate line if data is output.

2. The light-sensing circuit of claim 1, wherein the high voltage is a higher voltage among a positive voltage that removes charges trapped in the light-sensing transistor and a voltage that turns ON the switching transistor, and the low voltage is a lower voltage among a threshold voltage of the switching transistor and a threshold voltage of the light-sensing transistor.

3. The light-sensing circuit of claim 1, wherein the light-sensing transistor includes
a substrate,
an insulating layer on the substrate,
the gate of the light-sensing transistor on at least a portion of the insulating layer,
a gate insulating layer that covers at least a surrounding of the gate of the light-sensing transistor and is on the insulating layer and the gate of the light-sening transistor,
the channel layer on the gate insulating layer,
a source and the drain of the light-sensing transistor respectively covering ends of the channel layer, and
a transparent insulating layer on the source, the drain, and the channel layer,
wherein the channel layer includes the light-sensitive oxide semiconductor.

4. The light-sensing circuit of claim 1, wherein the light-sensing transistor comprises:
a substrate;
the channel layer on the substrate;
a gate insulating layer on a center portion of the channel layer;
the gate of the light-sensing transistor on the gate insulating layer;
a source and the drain of the light-sensing transistor at an interval from the gate of the light-sensing transistor and on both sides of the gate of the light-sending transistor on the channel layer; and
a transparent insulating layer on the gate, the source, and the drain,
wherein the channel layer includes the light-sensitive oxide semiconductor.

5. The light-sensing circuit of claim 1, wherein the light-sensitive oxide semiconductor includes a ZnO-based oxide.

6. The light-sensing circuit of claim 5, wherein the ZnO-based oxide includes ZnO or a mixture including ZnO and at least one material selected from a group consisting of Hf, Y, Ta, Zr, Ti, Cu, Ni, Cr, In, Ga, Al, Sn, and Mg.

7. The light-sensing circuit of claim 1, wherein a degree of sensitivity of the light-sensitive transistor is dependent on a color or a wavelength of light incident on the light-sensitive transistor.

8. The light-sensing circuit of claim 1, wherein a degree of sensitivity of the light-sensitive transistor is dependent on an intensity of light incident on the light-sensitive transistor.

9. The light-sensing circuit of claim 1, wherein a degree of sensitivity of the light-sensitive transistor is dependent on a color and an intensity of light incident on the light-sensitive transistor.

10. A light-sensing apparatus comprising:
a light-sensing panel configured to sense incident light;
a gate driver configured to provide a gate voltage to the light sensing panel;
a data driver configured to measure an output of the light sensing panel; and
an analog digital (A/D) converter (ADC) configured to convert an analog signal output by the data driver into a digital signal,
wherein the light-sensing panel includes an array of a plurality of light-sensing pixels, each of the light-sensing pixels including the light-sensing circuit of claim 1.

11. The light-sensing apparatus of claim 10, wherein the light-sensing panel further comprises:

a plurality of first gate lines and second gate lines as rows, and
a plurality of driving voltage lines and data lines as columns.

12. The light-sensing apparatus of claim 11, wherein the first and second gate lines are connected to the gate driver, and the data lines are connected to the data driver.

13. The light-sensing apparatus of claim 12, wherein the gate driver is configured to sequentially provide a gate voltage to rows of the light-sensing pixels via the first and second gate lines.

14. The light-sensing apparatus of claim 10, wherein the light-sensing apparatus is an image acquisition device, or a remote optical touch panel.

15. The light-sensing circuit of claim 1, wherein a source of the light-sensing transistor is connected to a drain of the switching transistor.

16. The light-sensing circuit of claim 1,
the light-sensing transistor includes source and drain electrodes, and
the light-sensitive oxide semiconductor is directly connected to the source and drain electrodes of the light-sensing transistor.

17. A light-sensing circuit comprising:
a light-sensing transistor configured to sense light;
a switching transistor connected in series with the light-sensing transistor,
the light-sensing transistor being a light-sensitive oxide semiconductor transistor including a light-sensitive oxide semiconductor as a channel layer, and
a source of the light-sensing transistor being configured to be electrically connected in series to a drain of the switching transistor independent of whether the switching transistor is on or off and independent of whether the light-sensing transistor is on or off;
a first gate line connected to a gate of the switching transistor;
a data line configured to be electrically connected to a source of the switching transistor independent of whether the switching transistor is on or off;
a driving voltage line configured to be electrically connected to a drain of the light-sensing transistor independent of whether the light-sensing transistor is on or off; and
a second gate line connected to a gate of the light-sensing transistor, wherein the driving voltage line and the second gate line are electrically separated from each other, and the light-sensing circuit is a pixel circuit, wherein
the light-sensing circuit is configured to apply a low voltage to the switching transistor via the first gate line and to apply a high voltage to the light-sensing transistor via the second gate line during a standby time,
the light-sensing circuit is configured to apply the high voltage to the switching transistor via the first gate line and to apply the low voltage to the light-sensing transistor via the second gate line if data is output through the switching transistor, and
the switching transistor is connected in series to the light-sensing transistor without a capacitor connected to a node between the light-sensing transistor and the switching transistor connected in series.

18. The light-sensing circuit of claim 17, wherein
the switching transistor does not have light-sensing characteristics.

19. The light-sensing circuit of claim 17, wherein
the light-sensitive oxide semiconductor is directly connected to the source and drain of the light-sensing transistor, and wherein
the light-sensing circuit is configured to apply a high voltage to the drain of the light-sensing transistor using the driving voltage line while simultaneously applying a low voltage of the to the gate of the light-sensing transistor.

20. The light-sensing circuit of claim 17, wherein the high voltage is a higher voltage among a positive voltage that removes charges trapped in the light-sensing transistor and a voltage that turns ON the switching transistor, and the low voltage is a lower voltage among a threshold voltage of the switching transistor and a threshold voltage of the light-sensing transistor.

21. The light-sensing circuit of claim 4, wherein the source and drain are each formed of a material that is one of,
a conductive metal oxide that is different than a material of the light-sensitive oxide semiconductor, and
a conductive metal.

22. The light-sensing circuit of claim 17, wherein
the source and drain of the light-sensing transistor are each formed of a material that is one of,
a conductive metal oxide that is different than the light-sensitive oxide semiconductor in the channel layer, and
a conductive metal.

* * * * *